(12) United States Patent
Paul et al.

(10) Patent No.: US 12,322,461 B2
(45) Date of Patent: Jun. 3, 2025

(54) DIELECTRIC FILM BASED ONE-TIME PROGRAMMABLE (OTP) MEMORY CELL

(71) Applicant: QUALCOMM Incorporated, San Diego, CA (US)

(72) Inventors: Abhijeet Paul, Escondido, CA (US); Mishel Matloubian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 177 days.

(21) Appl. No.: 18/186,734

(22) Filed: Mar. 20, 2023

(65) Prior Publication Data
US 2024/0321369 A1  Sep. 26, 2024

(51) Int. Cl.
| | |
|---|---|
| *G11C 17/16* | (2006.01) |
| *G11C 17/18* | (2006.01) |
| *H01L 23/525* | (2006.01) |
| *H10B 20/25* | (2023.01) |

(52) U.S. Cl.
CPC ............ *G11C 17/165* (2013.01); *G11C 17/18* (2013.01); *H01L 23/5256* (2013.01); *H10B 20/25* (2023.02)

(58) Field of Classification Search
CPC ........ G11C 17/18; G11C 17/165; H10B 20/25
USPC .......................................................... 365/96
See application file for complete search history.

(56) References Cited

U.S. PATENT DOCUMENTS

2024/0292610 A1* 8/2024 Fornara .................. G11C 17/18

FOREIGN PATENT DOCUMENTS

| CN | 115312492 | * | 8/2022 |
|---|---|---|---|
| CN | 115312492 A | | 11/2022 |

OTHER PUBLICATIONS

International Search Report and Written Opinion—PCT/US2024/017307—ISA/EPO—Jun. 17, 2024.
Park J.Y., et al., "Single-Wafer Process for Improved Metal Contact Hole Cleaning", Solid State Technology, Pennwell Corporation, Tulsa, OK, US, vol. 50, No. 5, May 2007, pp. 50-52, XP001518114, Figure 1.
Wolf S., "Chapter 13. Polycides and Salicides of TiSi2, CoSi2, and NiSi", Silicon Processing for the VLSI ERA, Lattice Press, Sunset Beach, CA, US, Jan. 2002, pp. 603-638, XP009148370, The whole document.

* cited by examiner

*Primary Examiner* — Sung Il Cho
(74) *Attorney, Agent, or Firm* — Muncy, Geissler, Olds & Lowe, P.C.

(57) ABSTRACT

Disclosed are techniques for a semiconductor structure. In an aspect, a semiconductor structure includes a conductive element on an isolation structure, a dielectric film, a first contact structure, wherein at least a portion of the dielectric film is disposed between the conductive element and the first contact structure, and a second contact structure disposed on and electrically coupled with the conductive element. The dielectric film is configured as a resistive element with the first contact structure and the second contact structure being terminals of the resistive element after a dielectric breakdown has occurred within the portion of the dielectric film. Also, the dielectric film is configured as an insulator of a capacitive element with the first contact structure and the second contact structure being terminals of the capacitive element in a case that no dielectric breakdown has occurred within the portion of the dielectric film.

30 Claims, 13 Drawing Sheets

DIELECTRIC FILM BASED ONE-TIME PROGRAMMABLE (OTP) MEMORY CELL

TECHNICAL FIELD

The present disclosure generally relates to semiconductor structures, and more particularly, to a one-time programmable (OTP) memory cell in an OTP memory array.

BACKGROUND

Integrated circuits (ICs) are becoming more prevalent in electronic devices. An IC may include an OTP memory array that is configured to store programs and/or parameters that are, once programmed, not subject to further changes or alterations. In some example, the memory cells of an OTP memory array may be implemented based on poly silicon electrical fuse (eFuse) technology. An eFuse OTP memory cell is programmed by forcing a high current density through a conductive link in order to completely rupture it or make its resistance significantly higher (e.g., the link is programmed to a high resistance state or an open circuit state).

However, an eFuse OTP memory cell may still be reprogrammed by thermal re-flow of the silicide (e.g., during a bump reflow process) and thus may corrupt the stored values. An eFuse OTP memory cell may still occupy a substantial area, and the resulting OTP memory array thus may have a low spatial density. Also, a high-current transistor may be needed to drive the current sufficient to cause electromigration of the silicide (e.g., rupture the link of the eFuse element). Accordingly, an eFuse OTP memory may not be suitable for a read-only memory (ROM) type of application or operations under a strict thermal or radioactive environment (that may cause thermal reflow of the silicide).

Therefore, there is a need for an OTP memory cell resistive to data corruption caused by thermal reflow and/or occupying a smaller area, while also compatible with a complementary metal-oxide semiconductor (CMOS) manufacturing process.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a semiconductor structure includes a conductive element on an isolation structure; a dielectric film; a first contact structure, wherein at least a portion of the dielectric film is disposed between the conductive element and the first contact structure; and a second contact structure disposed on and electrically coupled with the conductive element, wherein: the dielectric film is configured as a resistive element with the first contact structure and the second contact structure being terminals of the resistive element after a dielectric breakdown has occurred within the portion of the dielectric film, and the dielectric film is configured as an insulator of a capacitive element with the first contact structure and the second contact structure being terminals of the capacitive element in a case that no dielectric breakdown has occurred within the portion of the dielectric film.

In an aspect, a method of manufacturing a semiconductor structure includes forming a conductive element on an isolation structure; forming a dielectric film adjacent to the conductive element; forming an interlayer dielectric layer over the conductive element and the dielectric film; forming a first opening through the interlayer dielectric layer based on a self-aligned contact etch process, the first opening at least partially exposing the dielectric film; forming a second opening through the interlayer dielectric layer and the dielectric film, and the second opening at least partially exposing an upper surface of the conductive element; forming a first contact structure in the first opening, at least a portion of the dielectric film being disposed between the conductive element and the first contact structure; and forming a second contact structure in the second opening, the second contact structure being above and electrically coupled with the conductive element.

In an aspect, a one-time programmable (OTP) memory array includes a plurality of bit lines; a plurality of word lines; and a plurality of memory cells, each memory cell being configured to be electrically coupled to one of the plurality of bit lines based on a selection of the corresponding memory by one of the plurality of word lines, wherein each memory cell of the plurality of memory cells comprises: a conductive element on an isolation structure; a dielectric film; a first contact structure, wherein at least a portion of the dielectric film is disposed between the conductive element and the first contact structure; and a second contact structure disposed on and electrically coupled with the conductive element, wherein: the dielectric film is configured as a resistive element with the first contact structure and the second contact structure being terminals of the resistive element after a dielectric breakdown has occurred within the portion of the dielectric film, and the dielectric film is configured as an insulator of a capacitive element with the first contact structure and the second contact structure being terminals of the capacitive element in a case that no dielectric breakdown has occurred within the portion of the dielectric film.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Figure 1:
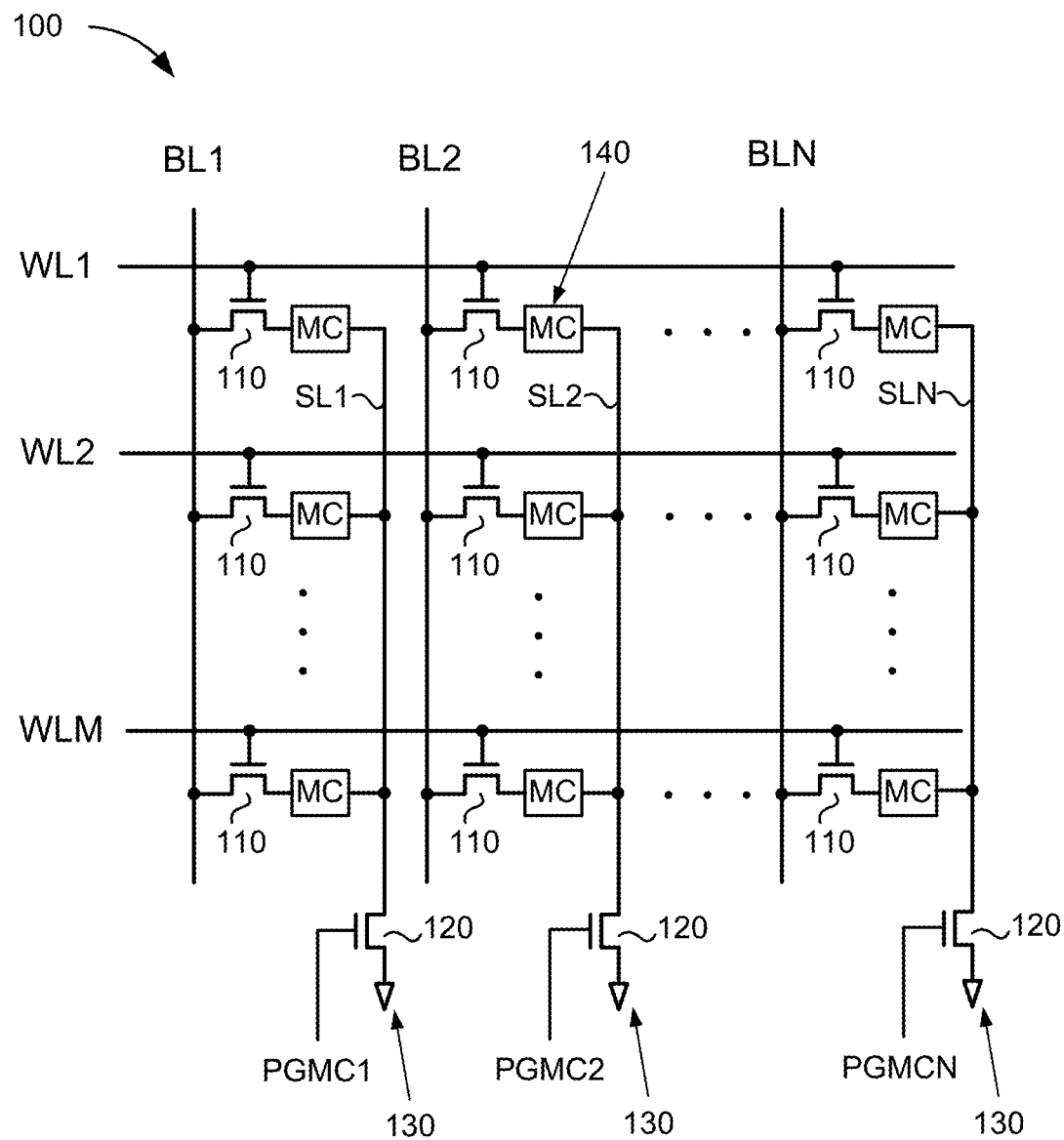
FIG. 1 illustrates an example architecture of a one-time programmable (OTP) memory array, according to aspects of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

According to the present application, a one-time programmable (OTP) memory cell in an OTP memory array may include a dielectric film disposed between a conductive element and a contact structure. In some aspects, the conductive element may be a gate structure or a dummy gate structure, and the dielectric film may be a spacer on a sidewall of the conductive element. In some aspects, the contact structure may be formed based on a self-aligned contact etch process. According to the present application, the dielectric film may be used as the weak point subject to a controllable dielectric breakdown by, e.g., a high voltage. In some aspects, the dielectric breakdown may create a low resistance state (i.e., programmed configuration) compared with an open circuit or a high resistance state before the dielectric breakdown occurs (i.e., unprogrammed configuration). Such dielectric breakdown may be an irreversible change to the OTP cell and thus lower the chance of the programmed OTP cell being subsequently changed or altered. The OTP memory cell may occupy a smaller area than an eFuse memory cell. Also, the OTP memory cell and the method of manufacturing the OTP memory cell as described in this disclosure may be compatible with a complementary metal-oxide semiconductor (CMOS) manufacturing process. In some aspects, the method of manufacturing the OTP memory cell as described in this disclosure may be integrated into a front end of line (FEOL) process (e.g., for fabricating various electrical components of an IC).

FIG. 1 illustrates an example architecture of an OTP memory array 100, according to aspects of the disclosure. The OTP memory array 100 includes M word lines (labeled as WL1, WL2 . . . . WLM), N bit lines (labeled as BL1, BL2, . . . , BLN), and N source lines (labeled as SL1, SL2, . . . . SLN). The memory array 100 further includes M×N OTP memory cells (labeled as MC). Each memory cell may be configured to be electrically coupled to one of the plurality of bit lines based on a selection of the corresponding memory cell by one of the plurality of word lines.

For example, each memory cell MC has a first terminal coupled with a respective selection transistor 110, which is electrically coupled with a corresponding bit line and controllable by a corresponding word line. Each memory cell MC has a second terminal coupled with a programming transistor 120 via a corresponding source line. Each programming transistor 120 is coupled with the corresponding source line (SL1, SL2, . . . , SLN) and a power source 130 (e.g., a ground or a source voltage VSS). Each programming transistor 120 is controllable by a corresponding programming control signal (labeled as PGMC1, PGMC2, . . . , PGMCN). To configure the memory array 100 into a fully functional memory, other driving circuits and control signals may be introduced, which are not depicted in FIG. 1 for clarity.

In operation, when the OTP memory cell 140 is to be programmed, the corresponding selection transistor may be turned on by the corresponding word line WL1, and the corresponding programming transistor 120 may be turned on by the corresponding source line programming control signal PGMC2. To program the OTP memory cell 140 to a programmed configuration, the corresponding bit line BL2 may be supplied with a programming voltage that is sufficient to effect the changes of the OTP memory cell 140 from the unprogrammed configuration to the programmed configuration.

Moreover, when the OTP memory cell 140 is to be read, the corresponding selection transistor may be turned on by the corresponding word line WL1, and the corresponding programming transistor 120 may be turned off by the corresponding source line programming control signal PGMC2. To read the OTP memory cell 140, the corresponding bit line BL2 may be supplied with a reading voltage, and the stored value may be readable at the corresponding source line SL2 based on whether the OPT memory cell is at a low resistance state (i.e., programmed configuration) or at an open circuit or a high resistance state (i.e., unprogrammed configuration).

Figure 2A:
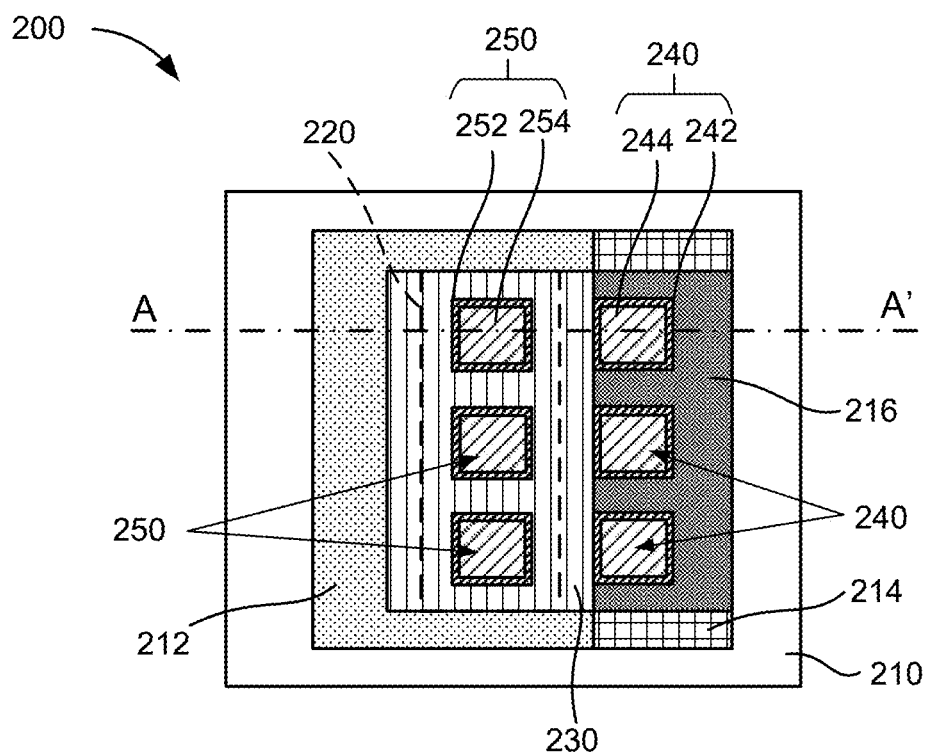
FIG. 2A is a top view of a semiconductor structure, according to aspects of the disclosure.

FIG. 2A is a top view of a semiconductor structure 200, according to aspects of the disclosure. The semiconductor structure 200 shows a simplified example of an OTP memory cell. In some aspects, the semiconductor structure 200 may be part of an IC and may be used as an OTP memory cell of the OTP memory array 100. In some aspects, various elements of the OTP memory cell may have shapes different from the example shown in FIG. 2A, and other elements or configurations for the OTP memory cell may be adopted in addition to the example shown in FIG. 2A. For example, an interlayer dielectric layer may cover at least a portion of the semiconductor structure 200, but is not depicted in FIG. 2A for better showing various components of the semiconductor structure 200.

As shown in FIG. 2A, the semiconductor structure 200 includes a substrate 210, an isolation structure 212 on the substrate 210, and a diffusion structure 214 adjacent to the isolation structure 212. A silicide structure 216 is disposed on the diffusion structure 214. In some aspects, an upper surface of the substrate 210 may be level with an upper surface of the isolation structure 212 and an upper surface of the silicide structure 216.

The semiconductor structure 200 further includes a conductive element 220 on the isolation structure 212 and a dielectric film 230 adjacent to the conductive element 220. In this non-limiting example, the dielectric film 230 is disposed on two sidewalls and an upper surface of the conductive element 220. In some aspects, the dielectric film 230 may be disposed on one or more of the sidewalls of the conductive element 220 without covering the upper surface of the conductive element 220.

Moreover, the semiconductor structure 200 includes one or more first contact structures 240 and one or more second contact structures 250. Each first contact structure 240 may include an intermediate layer 242 surrounding a conductive filling 244. Each second contact structure 250 may include an intermediate layer 252 surrounding a conductive filling 254.

In some aspects, the substrate 210 may be silicon (Si) substrate or a III-V substrate (e.g., including III-V materials such as gallium arsenide (GaAs), gallium antimonide (GaSb), gallium phosphide (GaP), indium phosphide (InP), indium arsenide (InAs), indium antimonide (InSb), or any combination thereof). In some aspects, the diffusion structure 214 may include silicon or III-V materials.

In some aspects, the isolation structure 212 may be a shallow trench isolation structure. In some aspects, the silicide structure 216 may be formed based on silicidation of silicon. In some aspects, the dielectric film 230 may include silicon oxide, silicon nitride, hafnium oxide, a low-k dielectric material (e.g., having a dielectric constant lower than that of $SiO_2$), or any combination thereof. In some aspects, the dielectric film may be formed based on a chemical vapor deposition (CVD) process, such as a high-density-plasma (HDP) CVD process.

In some aspects, the first contact structure 240 or the second contact structure 250 may include a refractory material. In some aspects, the refractory material may include tungsten, cobalt, titanium nitride, tantalum nitride, or any combination thereof. In some aspects, the conductive filling 244 or the conductive filling 254 may include a refractory material, such as tungsten, cobalt, titanium nitride, tantalum nitride, or any combination thereof. In some aspects, the intermediate layer 242 or the intermediate layer 252 may include titanium, titanium nitride, or any combination thereof.

Figure 2B:
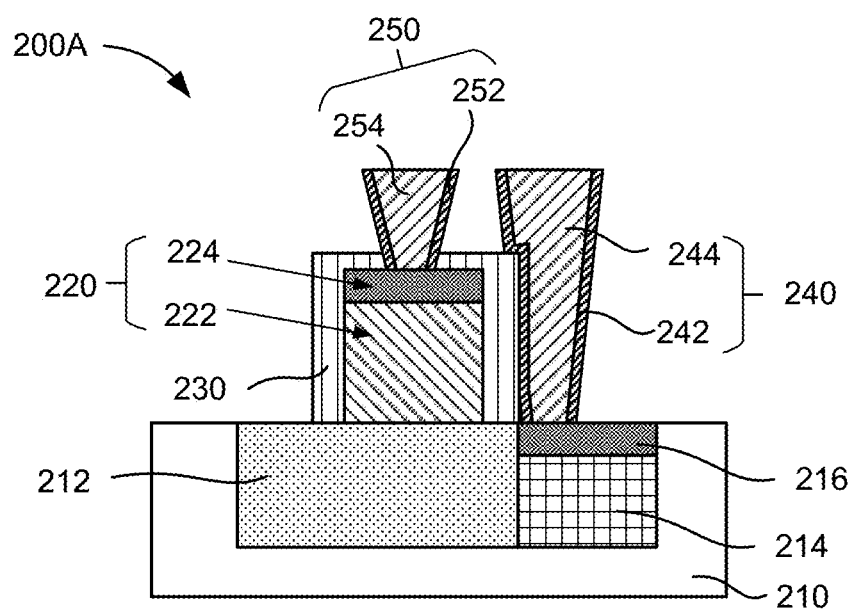
FIGS. 2B and 2C are cross-sectional views of a semiconductor structure, according to aspects of the disclosure.

FIG. 2B is a cross-sectional view of a semiconductor structure 200A, according to aspects of the disclosure. The semiconductor structure 200A may correspond to the semiconductor structure 200 in a unprogrammed configuration. The cross-sectional view may be taken along the reference line A-A' shown in FIG. 2A. Components in FIG. 2B that are the same or similar as those in FIG. 2A are depicted using the same shades and are given the same reference numbers.

As shown in FIG. 2B, as a non-limiting example, the conductive element 220 may include a polysilicon portion 222 on the isolation structure 212 and a silicide portion 224 between the polysilicon portion 222 and the second contact structure 250.

In some aspects, the conductive element 220 may be formed based on a process of forming a gate structure or a dummy gate structure, and the dielectric film 230 may be formed based on a process of forming a spacer on a sidewall of the conductive element 220. In some aspects, the polysilicon portion 222 may include p-type or n-type doped polysilicon. In some aspects, the silicide portion 224 may be formed based on silicidation of silicon.

As shown in FIG. 2B, at least a portion of the dielectric film 230 may be disposed between the conductive element 220 and the first contact structure 240. In a case that no dielectric breakdown has occurred within the portion of the dielectric film 230, the dielectric film 230 may electrically separate the first contact structure 240 and the second contact structure 250. As such, the semiconductor structure 200A may be in the unprogrammed configuration, where the dielectric film 230 may be configured as an insulator of a capacitive device, with the first contact structure 240 and the second contact structure 250 being two terminals of the capacitive device. In some aspects, the conductivity characteristic between the first contact structure 240 and the second contact structure 250 may exhibit a high resistance state or an open circuit state.

Figure 2C:
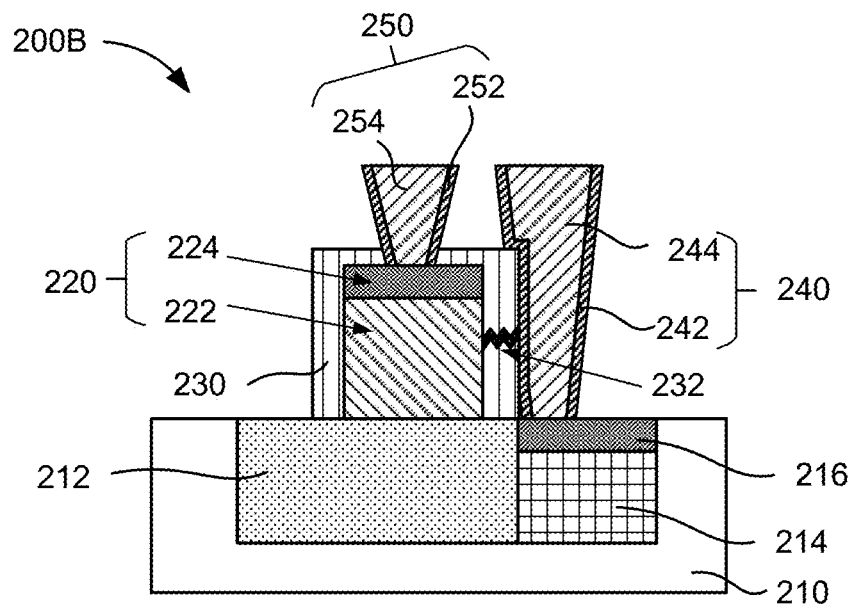

FIG. 2C is a cross-sectional view of a semiconductor structure 200B, according to aspects of the disclosure. The semiconductor structure 200B may correspond to the semiconductor structure 200 in a programmed configuration. The cross-sectional view may be taken along the reference line A-A' shown in FIG. 2A. Components in FIG. 2C that are the same or similar as those in FIGS. 2A and 2B are depicted using the same shades and are given the same reference numbers.

As shown in FIG. 2C, in a case that a dielectric breakdown has occurred within the portion of the dielectric film 230 (e.g., forming the breakdown portion 232) between the conductive element 220 and the first contact structure 240, the dielectric film 230 may electrically couple the first contact structure 240 and the second contact structure 250 via the breakdown portion 232. As such, the semiconductor structure 200B may be in the programmed configuration, where the dielectric film 230 may be configured as a resistive device with the first contact structure and the second contact structure being two terminals of the resistive device. In some aspects, the conductivity characteristic between the first contact structure 240 and the second contact structure 250 may exhibit a low resistance state.

Figure 2D:
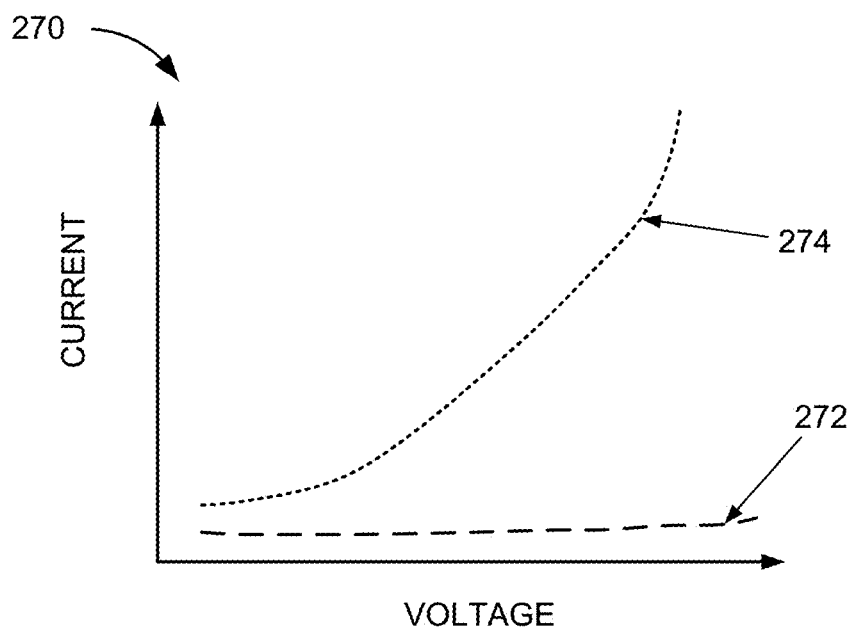
FIG. 2D illustrates voltage-current characteristics of an OTP cell having a unprogrammed configuration or having a programmed configuration, according to aspects of the disclosure.

FIG. 2D illustrates voltage-current characteristics 270 of an OTP cell having a unprogrammed configuration (e.g., the semiconductor structure 200A, corresponding to Curve 272 in FIG. 2D) or having a programmed configuration (e.g., the semiconductor structure 200B, corresponding to Curve 274 in FIG. 2D), according to aspects of the disclosure.

In some aspects, when the semiconductor structure is in the unprogrammed configuration (e.g. semiconductor structure 200A), the dielectric film may be configured as the insulator of a capacitive element. Therefore, the voltage-current characteristic between the first contact structure 240 and the second contact structure 250 may be represented by Curve 272, where the current level stays low regardless of the voltage drop between the first contact structure 240 and the second contact structure 250.

In some aspects, when the semiconductor structure is in the programmed configuration (e.g. semiconductor structure 200B), the dielectric film may be configured as a resistive element. Therefore, the voltage-current characteristic between the first contact structure 240 and the second contact structure 250 may be represented by Curve 274, where a higher voltage drop between the first contact structure 240 and the second contact structure 250 corresponds to a higher current level.

Figure 3A:
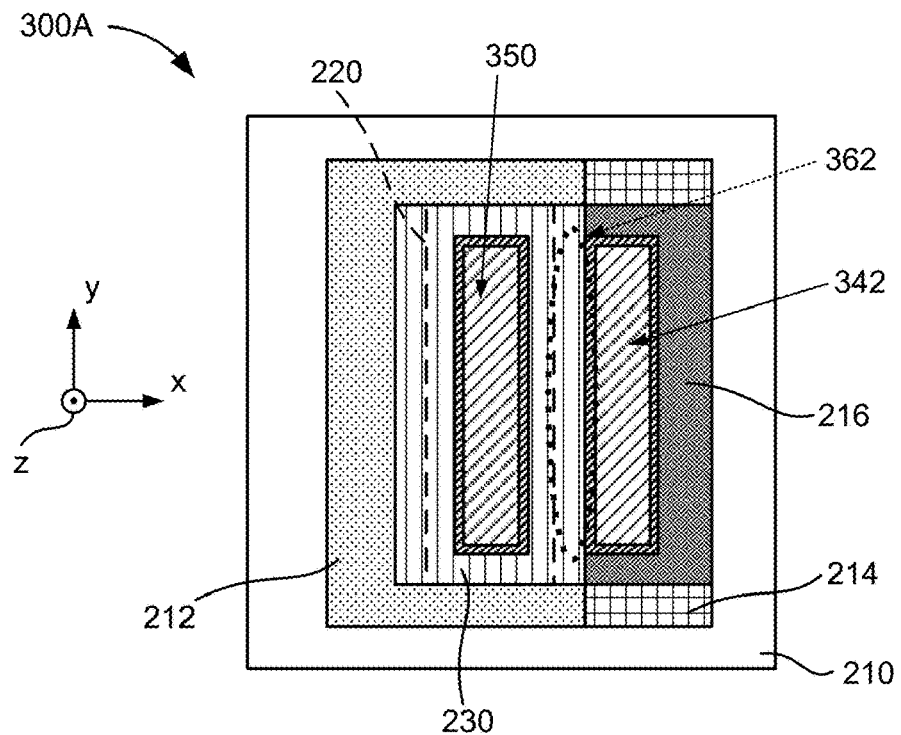
FIGS. 3A-3C are top views of various example OTP memory cells, according to aspects of the disclosure.
Figure 3B:
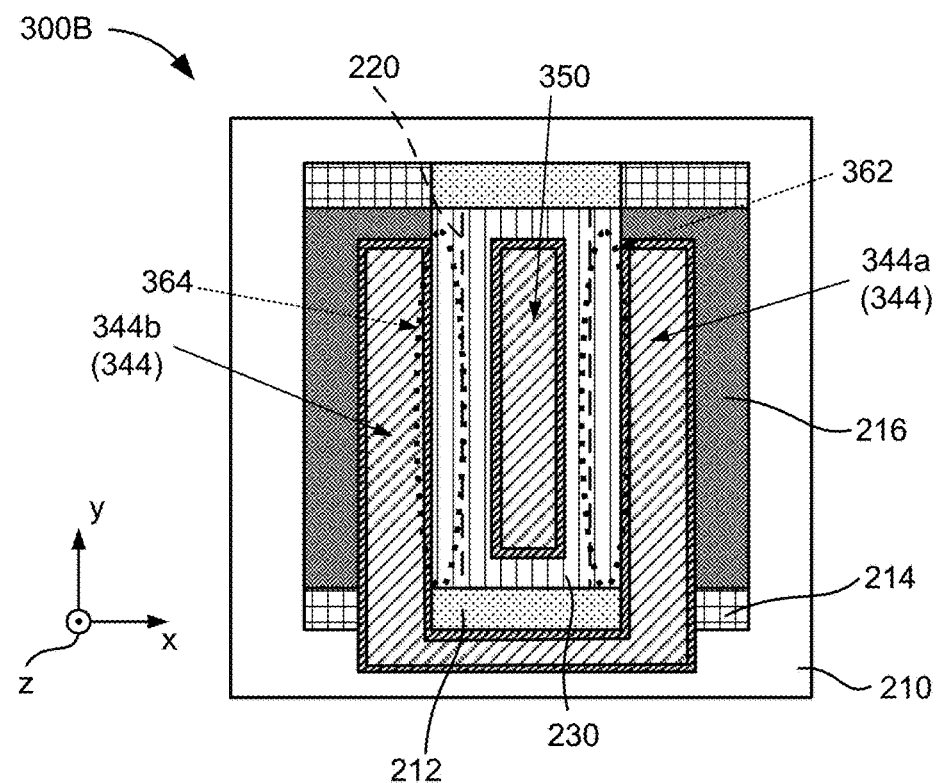
Figure 3C:
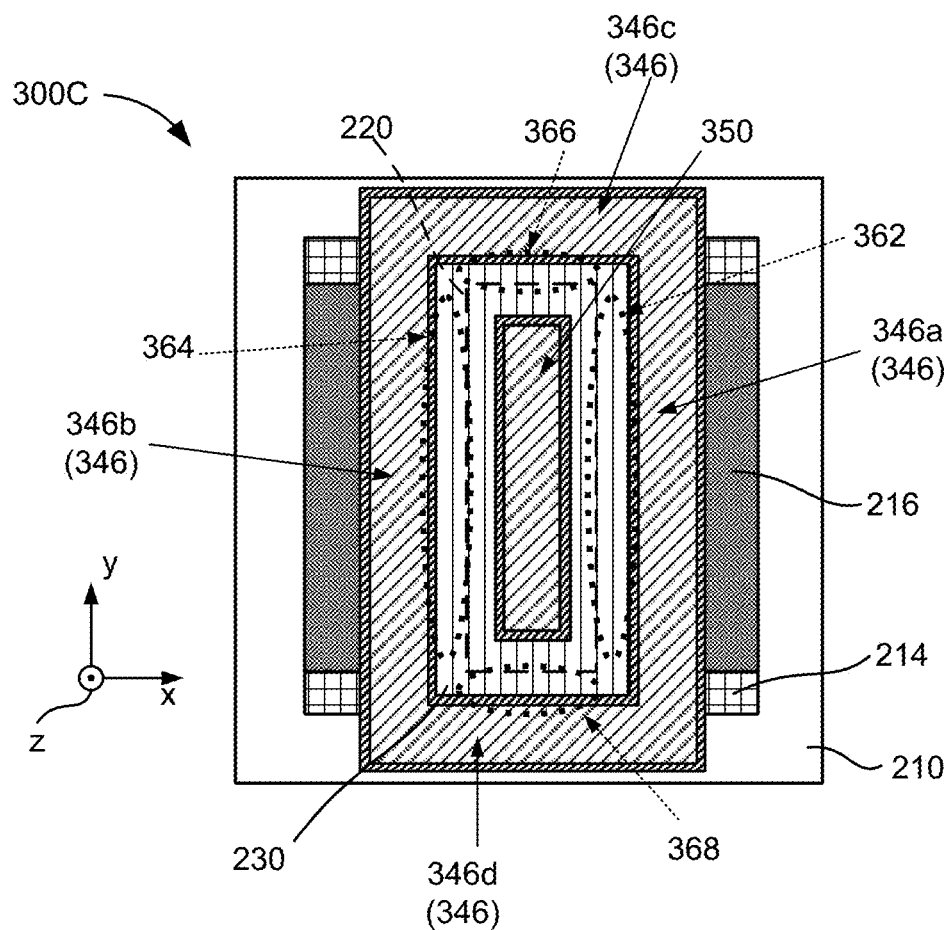

FIGS. 3A-3C are top views of various example OTP memory cells, according to aspects of the disclosure. In some aspects, the one or more first contact structures 240, the one or more second contact structures 250, the dielectric film 230, and the conductive element 220 of the semiconductor structure 200 may be modified to increase the area of the portion of the dielectric film 230 that may be disposed between the one or more first contact structures 240 and the conductive element 220. The increased area of the portion of the dielectric film 230 between the one or more first contact structures 240 and the conductive element 220 may increase the performance and efficiency of causing the breakdown within the dielectric film 230 (e.g., by providing more possible paths for the dielectric breakdown) when programming a resulting OPT memory cell.

FIG. 3A illustrates a top view of a first example semiconductor structure 300A that corresponds to a simplified example of an OTP memory cell. The components of the semiconductor structure 300A that are the same or similar to those of the semiconductor structure 200, 200A, or 200B are given the same reference numbers, and the detailed description thereof may be omitted.

In some aspects, the semiconductor structure 300A may include a first contact structure 342 that corresponds to the one or more first contact structures 240 and a second contact structure 350 that corresponds to the one or more second contact structures 250. The conductive element 220 may be over the isolation structure 212 with respect to a vertical direction (e.g., the z direction coming out of the page) and extends along a first horizontal direction (e.g., the y direction) perpendicular to the vertical direction. The first contact structure 342 may include at least a portion (e.g., the first contact structure 342 itself on the positive x direction side of the conductive element 220 in this example) extending along the first horizontal direction. Also, the portion of the dielectric film 230 between the conductive element 220 and the first contact structure 342 may include at least a sub-portion of the dielectric film 230 in the region 362. The sub-portion of the dielectric film 230 in the region 362 may provide possible paths for the dielectric breakdown to occur when programming an OPT memory cell based on the semiconductor structure 300A.

FIG. 3B illustrates a top view of a second example semiconductor structure 300B that corresponds to a simplified example of an OTP memory cell. The components of the semiconductor structure 300B that are the same or similar to those of the semiconductor structure 200, 200A, or 200B are given the same reference numbers, and the detailed description thereof may be omitted.

In some aspects, the semiconductor structure 300B may include a first contact structure 344 that corresponds to the one or more first contact structures 240 and a second contact structure 350 that corresponds to the one or more second contact structures 250. The conductive element 220 may be over the isolation structure 212 with respect to a vertical direction (e.g., the z direction coming out of the page) and extends along a first horizontal direction (e.g., the y direction) perpendicular to the vertical direction. The first contact structure 344 may have a U shape and may include at least two portions (e.g., the portion 344a and the portion 344b on the positive x direction side and the negative x direction side of the conductive element 220 in this example) extending along the first horizontal direction. Also, the portion of the dielectric film 230 between the conductive element 220 and the first contact structure 344 may include at least a sub-portion of the dielectric film 230 in the region 362 and a sub-portion of the dielectric film 230 in the region 364. The sub-portions of the dielectric film 230 in the regions 362 and 364 may provide possible paths for the dielectric breakdown to occur when programming an OPT memory cell based on the semiconductor structure 300B.

FIG. 3C illustrates a top view of a third example semiconductor structure 300C that corresponds to a simplified example of an OTP memory cell. The components of the semiconductor structure 300C that are the same or similar to those of the semiconductor structure 200, 200A, or 200B are given the same reference numbers, and the detailed description thereof may be omitted.

In some aspects, the semiconductor structure 300C may include a first contact structure 346 that corresponds to the one or more first contact structures 240 and a second contact structure 350 that corresponds to the one or more second contact structures 250. The conductive element 220 may be over the isolation structure 212 with respect to a vertical direction (e.g., the z direction coming out of the page) and extends along a first horizontal direction (e.g., the y direction) perpendicular to the vertical direction.

Moreover, the first contact structure 346 may have a hollow shape and may include at least two portions (e.g., the portion 346a and the portion 346b on the positive x direction side and the negative x direction side of the conductive element 220 in this example) extending along the first horizontal direction. The first contact structure 346 may further include at least two portions (e.g., the portion 346c and the portion 346d on the positive y direction side and the negative y direction side of the conductive element 220 in this example) extending along a second horizontal direction perpendicular to the vertical direction (e.g., the x direction). Also, the portion of the dielectric film 230 between the conductive element 220 and the first contact structure 346 may include at least a sub-portion of the dielectric film 230 in the region 362, a sub-portion of the dielectric film 230 in the region 364, a sub-portion of the dielectric film 230 in the region 366, and a sub-portion of the dielectric film 230 in the region 368. The sub-portions of the dielectric film 230 in the regions 362, 364, 366, and 368 may provide possible paths for the dielectric breakdown to occur when programming an OPT memory cell based on the semiconductor structure 300C.

Figure 4:
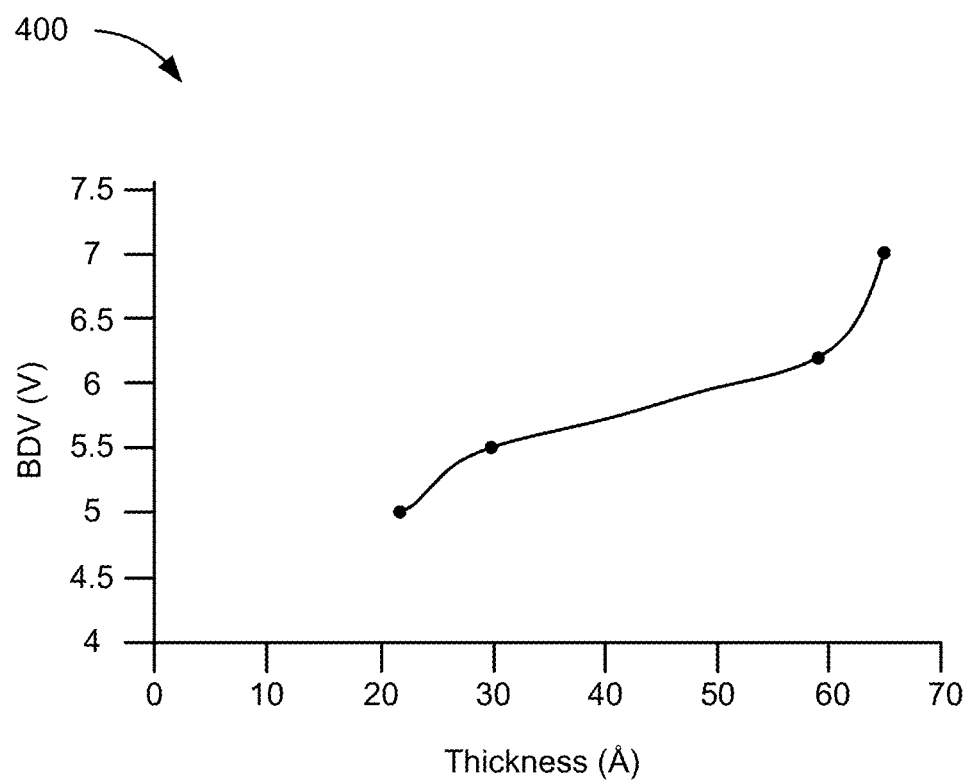
FIG. 4 illustrates a relationship between the breakdown voltages and the dielectric film thicknesses, according to aspects of the disclosure.

FIG. 4 illustrates a relationship 400 between the breakdown voltages (labeled as "BDV" and in units of volts, V) and the dielectric film thicknesses (labeled as "Thickness" and in units of angstroms, Å), according to aspects of the disclosure. As a non-limiting example, FIG. 4 shows the relationship 400 when $SiO_2$ is used to form the dielectric film (e.g., the dielectric film 230 in FIGS. 2A-2C and 3A-3C), and the dielectric breakdown occurs by applying a programming voltage for one microsecond.

As shown in FIG. 4, in this non-limiting example, the breakdown voltage of the dielectric film ($SiO_2$) may range from 5 V to 7 V when the film thickness ranges from about 22 Å to 65 Å. In some aspects, the dielectric film ($SiO_2$) may be formed based on a CVD process, such as an HDP CVD process. In some aspects, the $SiO_2$ thickness may be controlled during the dielectric film formation process and the self-aligned contact etching process to obtain a designed thickness on the vertical sidewall of the conductive element 220 (e.g., the sub-portion of the dielectric film 230 in the region 362 in FIG. 3A), which may be programmable using a designed programming voltage based on the relationship 400.

FIGS. 5A-5G illustrate an example partial method for manufacturing a semiconductor structure (such as the semiconductor structure 200B in FIG. 2B), according to aspects of the disclosure. The components depicted in FIGS. 5A-5G that are the same or similar to those of the semiconductor structure 200, 200A, or 200B are given the same reference numbers, and the detailed description thereof may be omitted.

Figure 5A:
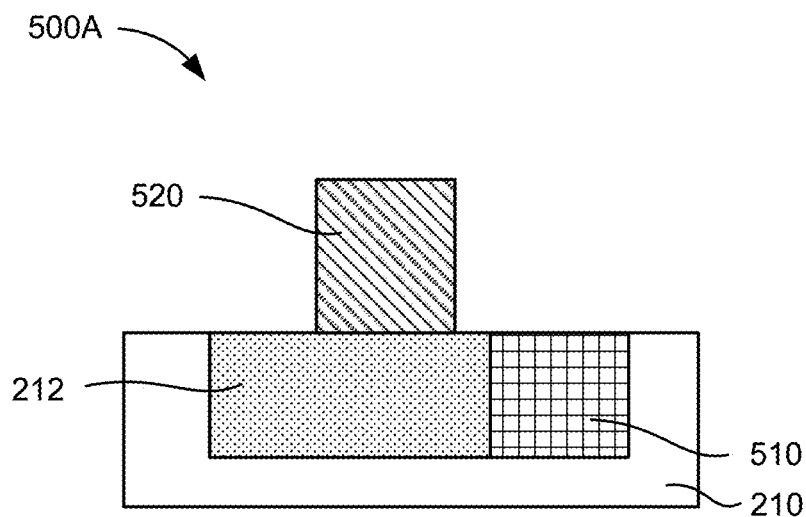
FIGS. 5A-5G illustrate an example partial method for manufacturing a semiconductor structure, according to aspects of the disclosure.

As shown in FIG. 5A, a semiconductor structure 500A is formed. The semiconductor structure 500A includes a substrate 210, an isolation structure 212 on the substrate 210, and a diffusion region 510 adjacent to the isolation structure 212. Also, a gate structure 520 is formed on the isolation structure 212. In some aspects, the gate structure 520 may be further processed into a conductive structure that may correspond to the conductive element 220 in FIG. 2B.

In some aspects, the gate structure 520 may be a polysilicon structure that includes polysilicon. In some aspects, the polysilicon structure may include p-type or n-type doped polysilicon. In some aspects, the polysilicon structure may be formed by an epitaxially growing process.

In some aspects, the isolation structure 212 may be a shallow trench isolation structure. In some aspects, the substrate 210 may be silicon (Si) substrate or a III-V substrate (e.g., including III-V materials such as gallium arsenide (GaAs), gallium antimonide (GaSb), gallium phosphide (GaP), indium phosphide (InP), indium arsenide (InAs), indium antimonide (InSb), or any combination thereof). In some aspects, the diffusion region 510 may include silicon or III-V materials.

Figure 5B:
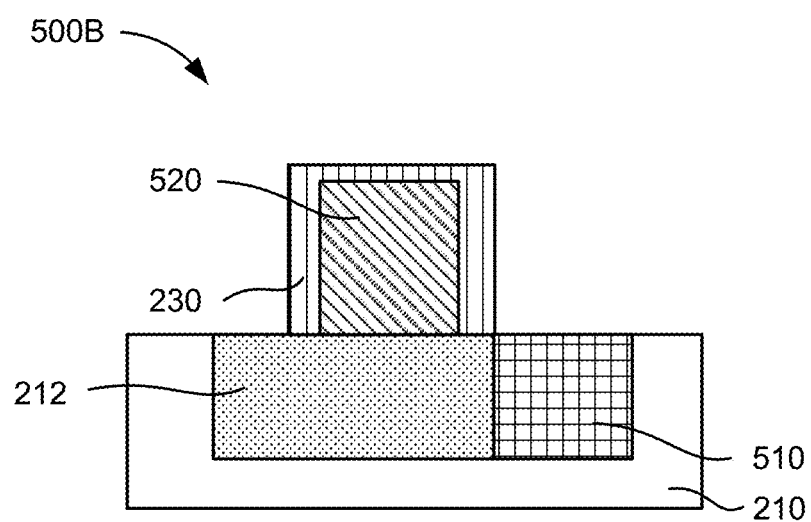

As shown in FIG. 5B, a semiconductor structure 500B is formed based on the semiconductor structure 500A, by forming a dielectric film 230 on sidewalls and the upper surface of the gate structure 520. As the gate structure 520 is to be processed to become the conductive element of the resulting OPT memory cell, the dielectric film 230 will be adjacent to the resulting conductive element or on sidewalls and the upper surface of the resulting conductive element.

In some aspects, the dielectric film 230 may include silicon oxide, silicon nitride, hafnium oxide, a low-k dielectric material (e.g., having a dielectric constant lower than that of $SiO_2$), or any combination thereof. In some aspects, the dielectric film may be formed based on a CVD process, such as an HDP CVD process.

In some aspects, to prepare the dielectric film for a subsequent self-aligned contact etch process, an etch stop layer may be formed on an upper surface of the dielectric film. In some aspects, the etch stop layer may include SiO, $Al_2O_3$, SiOH, or any combination thereof. In some aspects, the etch stop layer may be formed based on a CVD process, such as a plasma-enhanced CVD (PECVD) process or a low pressure CVD (LPCVD) process.

Figure 5C:
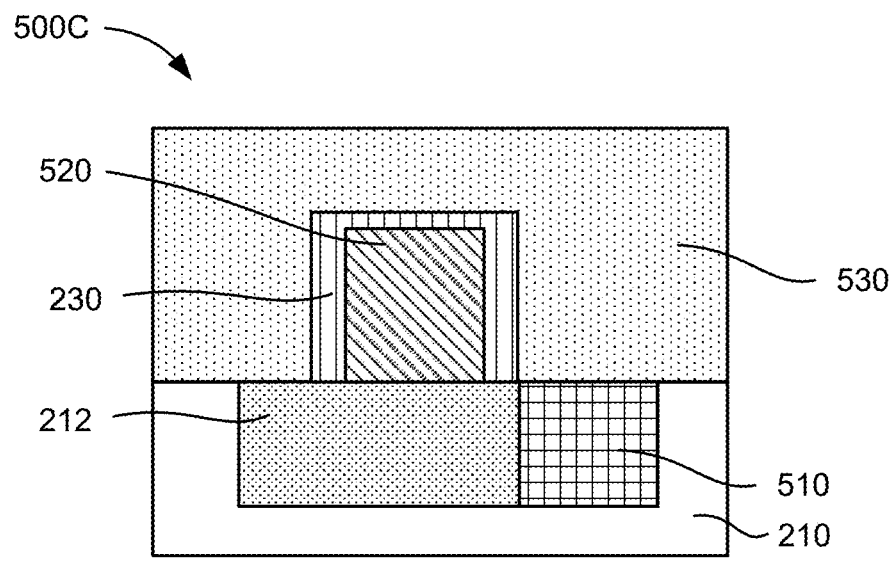

As shown in FIG. 5C, a semiconductor structure 500C is formed based on the semiconductor structure 500B, by forming an interlayer dielectric layer 530 over the semiconductor structure 500B. In some aspects, the interlayer dielectric layer 530 may include $SiO_2$, and the interlayer dielectric layer 530 may be formed based on a CVD process.

Figure 5D:
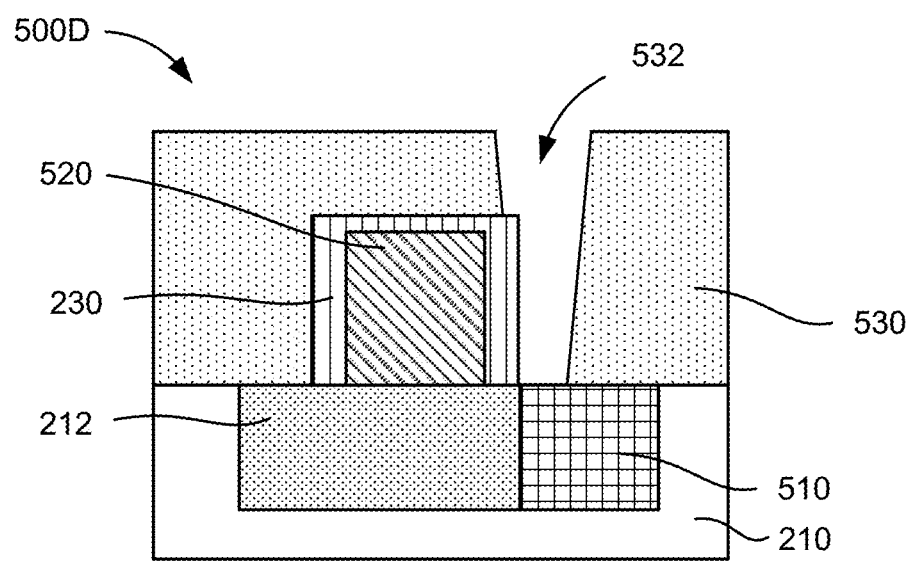

As shown in FIG. 5D, a semiconductor structure 500D is formed based on the semiconductor structure 500C, by forming a first opening 532 through the interlayer dielectric layer 530 based on a self-aligned contact etch process. As a result of the self-aligned contact etch process, the first opening 532 may at least partially expose the dielectric film 230. In some aspects, the first opening 532 may at least partially expose an upper surface of the diffusion region 510.

Figure 5E:
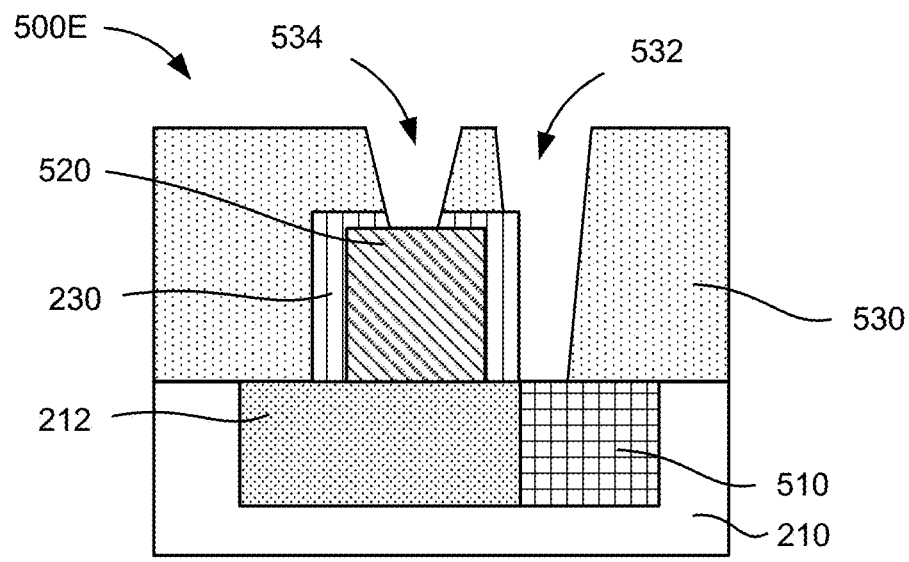

As shown in FIG. 5E, a semiconductor structure 500E is formed based on the semiconductor structure 500D, by forming a second opening 534 through the interlayer dielectric layer 530 and the dielectric film 230. In some aspects, the second opening 534 may at least partially expose an upper surface of the gate structure 520 (from which the conductive structure will be formed).

Figure 5F:
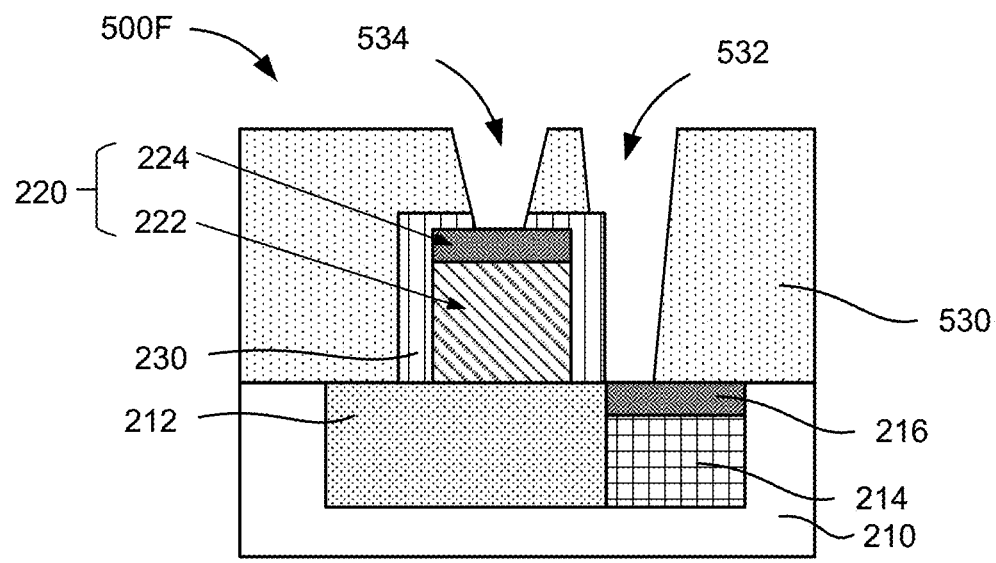

As shown in FIG. 5F, a semiconductor structure 500F is formed based on the semiconductor structure 500E, by performing a silicidation process. The silicidation process may convert an upper portion of the polysilicon structure (e.g., the gate structure 520) into a silicide portion 224 of a conductive element 220 and leave a lower portion of the polysilicon structure as a polysilicon portion 222 of the conductive element 220. The silicidation process may also convert an upper portion of the diffusion region 510 into a silicide structure 216 and leave a lower portion of the diffusion region as a diffusion structure 214.

Figure 5G:
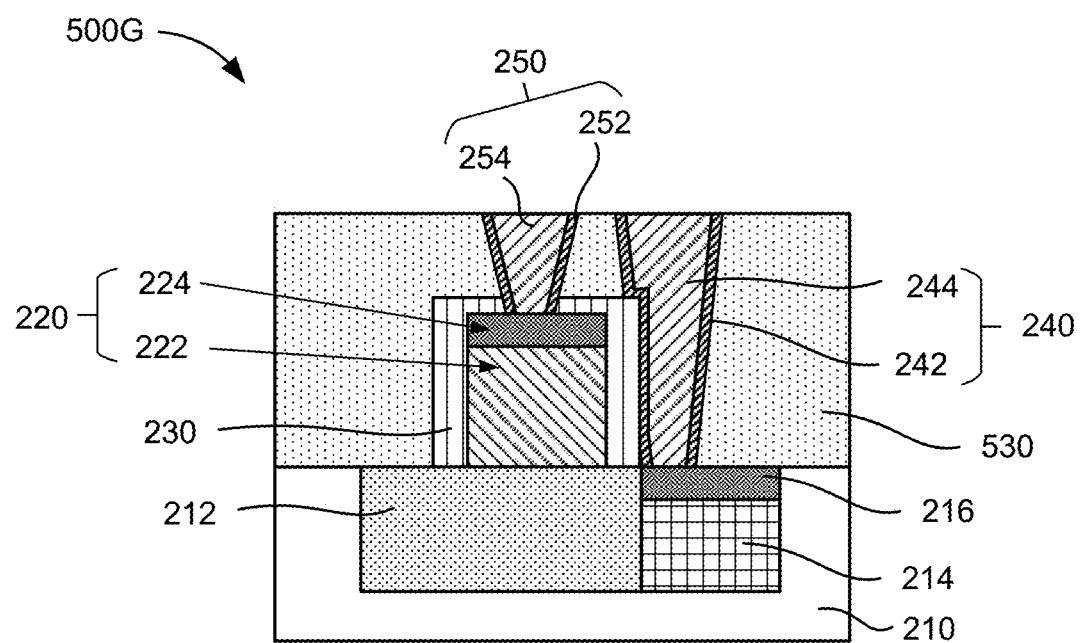

As shown in FIG. 5G, a semiconductor structure 500G is formed based on the semiconductor structure 500F, by forming a first contact structure 240 in the first opening 532 and forming a second contact structure 250 in the second opening 534. In some aspects, at least a portion of the dielectric film 230 may be disposed between the conductive element 220 and the first contact structure 240. In some aspects, the second contact structure 250 may be above and electrically coupled with the conductive element 220. As shown in FIG. 5G, the semiconductor structure 500G may correspond to the semiconductor structure 200A in FIG. 2B, with the interlayer dielectric layer 530 shown in FIG. 5G.

In some aspects, the forming the first contact structure 240 may include forming an intermediate layer 242 in the first opening 532, and filing the first opening 532 with a conductive filling 244 that includes a refractory material, such that the intermediate layer 242 surrounds the conductive filling 244 in the first opening 532. In some aspects, the forming the second contact structure 250 may include forming an intermediate layer 252 in the second opening 534, and filing the second opening 534 with a conductive filling 254 that includes the refractory material, such that the intermediate layer 252 surrounds the conductive filling 254 in the second opening 534. In some aspects, the refractory material may include tungsten, cobalt, titanium nitride, tantalum nitride, or any combination thereof.

Figure 6:
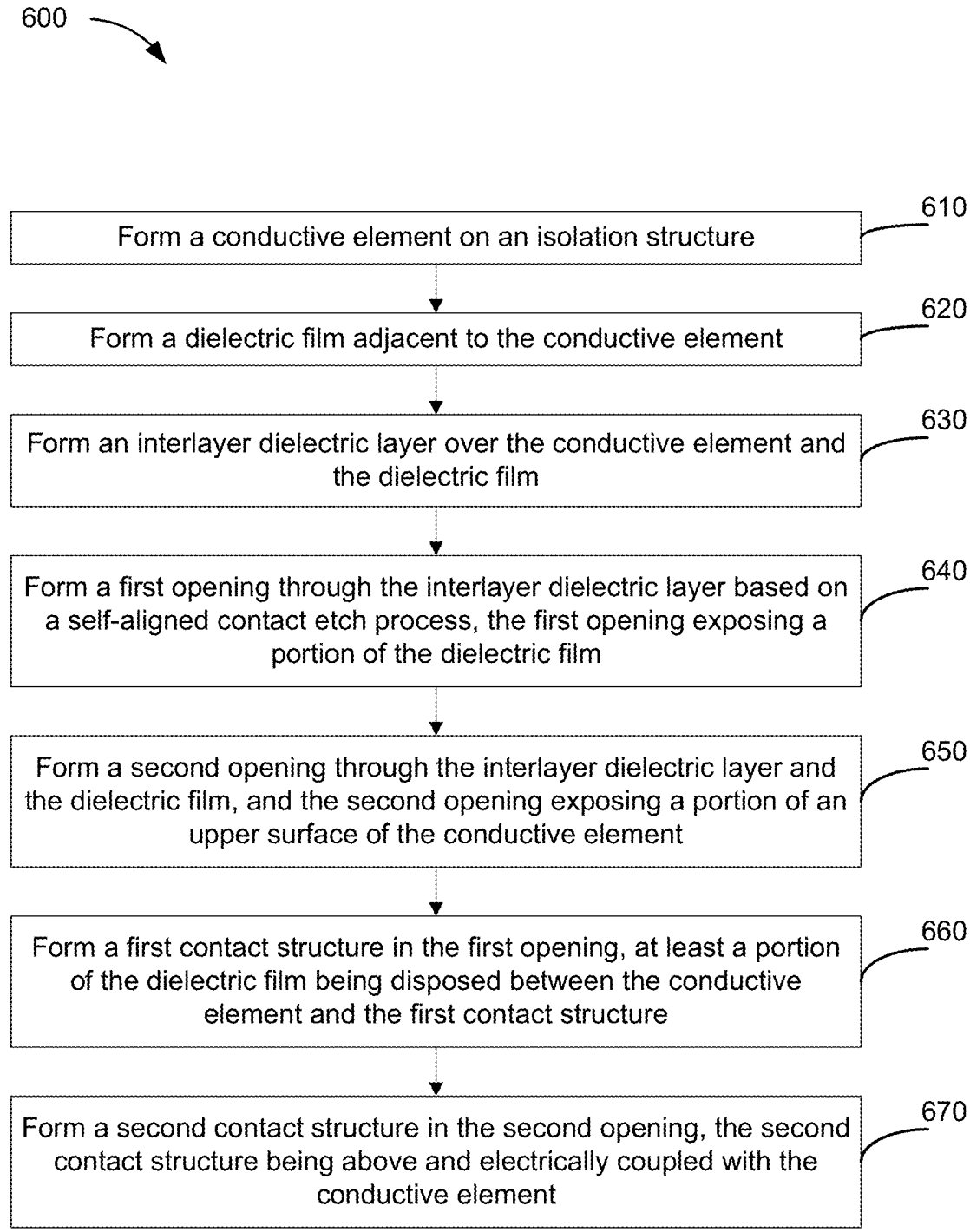
FIG. 6 illustrates a method for manufacturing a semiconductor structure, according to aspects of the disclosure.

FIG. 6 illustrates a method 600 for manufacturing a semiconductor structure (such as the semiconductor structure 200 in FIG. 2A, 200A in FIG. 2B, or 500G in FIG. 5G), according to aspects of the disclosure.

At operation 610, a conductive element (e.g., the conductive element 220) is formed on an isolation structure (e.g., the isolation structure 212). In some aspects, the conductive element may be first formed as a gate structure or a dummy gate structure, and then in a later stage processed to become the conductive element.

At operation 620, a dielectric film (e.g., the dielectric film 230) adjacent to the conductive element (e.g., the conductive element 220) is formed. In some aspects, the dielectric film may be formed based on a CVD process, such as an HDP CVD process. In some aspects, the dielectric film may be formed on sidewalls and the upper surface of the conductive element. In some aspects, the dielectric film may include silicon oxide, silicon nitride, hafnium oxide, a low-k dielectric material, or any combination thereof.

In some aspects, to prepare the dielectric film for a subsequent self-aligned contact etch process, an etch stop layer may be formed on an upper surface of the dielectric film. In some aspects, the etch stop layer may include SiO, $Al_2O_3$, SiOH, or any combination thereof. In some aspects, the etch stop layer may be formed based on a CVD process, such as a PECVD process or an LPCVD process.

At operation 630, an interlayer dielectric layer (e.g., the interlayer dielectric layer 530) may be formed over the conductive element and the dielectric film. In some aspects, the interlayer dielectric layer may include $SiO_2$, and the interlayer dielectric layer may be formed based on a CVD process.

At operation 640, a first opening (e.g., the first opening 532) through the interlayer dielectric layer is formed based on a self-aligned contact etch process. In some aspects, the first opening may at least partially expose the dielectric film.

In some aspects, the first opening may at least partially expose an upper surface of a diffusion region adjacent to the isolation structure. After the first opening is formed, an upper portion of the diffusion region may be converted into a silicide structure based on a silicidation process, which leaves a lower portion of the diffusion region as a diffusion structure.

At operation 650, a second opening (e.g., the second opening 534) through the interlayer dielectric layer and the dielectric film is formed. In some aspects, the second opening may at least partially expose an upper surface of the conductive element.

In some aspects, the conductive element may be formed based on first forming a polysilicon structure on the isolation structure. After the second opening is formed, an upper portion of the polysilicon structure may be converted into a silicide portion of the conductive element based on a silicidation process, which leaves a lower portion of the polysilicon structure as a polysilicon portion of the conductive element.

At operation 660, a first contact structure (e.g., the first contact structure 240) is formed in the first opening. At least a portion of the dielectric film may be disposed between the conductive element and the first contact structure. In some aspects, the first contact structure may be formed based on first forming an intermediate layer in the first opening, and then filling the first opening with a conductive filling, such that the intermediate layer surrounds the conductive filling in the first opening. In some aspects, the refractory material may include tungsten, cobalt, titanium nitride, tantalum nitride, or any combination thereof.

At operation 670, a second contact structure (e.g., the second contact structure 250) is formed in the second opening. The second contact structure may be above and electrically coupled with the conductive element. In some aspects, the second contact structure may be formed based on first forming an intermediate layer in the second opening, and then filling the second opening with a conductive filling, such that the intermediate layer surrounds the conductive filling in the second opening. In some aspects, the refractory material may include tungsten, cobalt, titanium nitride, tantalum nitride, or any combination thereof.

As will be appreciated, a technical advantage of the method 600 is to form a semiconductor structure that may be used as an OTP memory cell, based on a dielectric film between a contact structure and a conductive structure. The OTP memory cell may be programmed based on dielectric breakdown of the dielectric film, and such dielectric breakdown may be an irreversible change to the OTP cell and thus lower the chance of the programmed OTP cell being subsequently changed or altered. The OTP memory cell may occupy a smaller area than an eFuse memory cell. Also, the method of manufacturing the OTP memory cell may be compatible with a CMOS manufacturing process.

Figure 7:
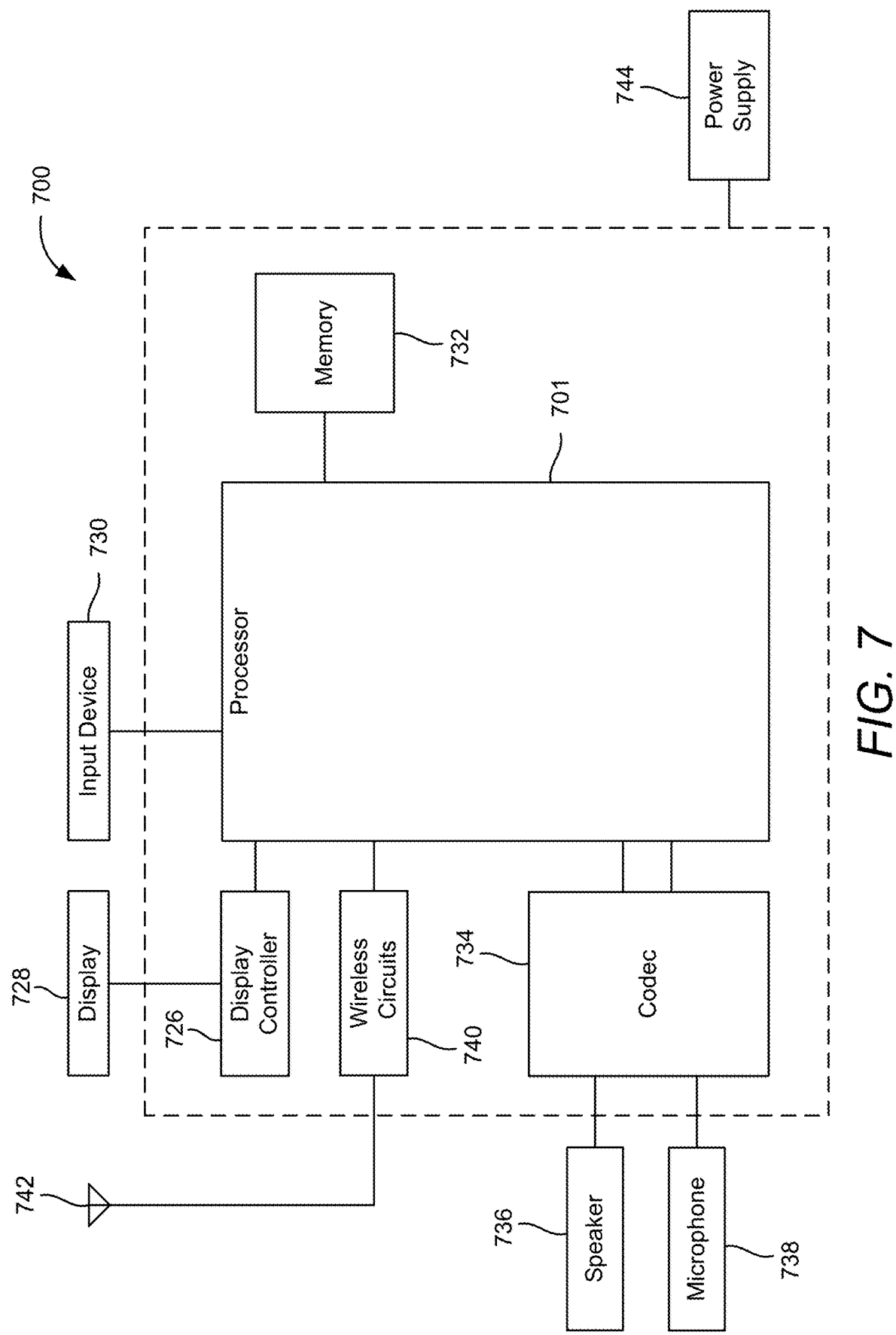
FIG. 7 illustrates a mobile device example, according to aspects of the disclosure.

FIG. 7 illustrates a mobile device 700, according to aspects of the disclosure. In some aspects, the mobile device 700 may be implemented by including one or more ICs including semiconductor structures manufactured based on the examples described in this disclosure.

In some aspects, mobile device 700 may be configured as a wireless communication device. As shown, mobile device 700 includes processor 701. Processor 701 may be communicatively coupled to memory 732 over a link, which may be a die-to-die or chip-to-chip link. Mobile device 700 also includes display 728 and display controller 726, with display controller 726 coupled to processor 701 and to display 728. The mobile device 700 may include input device 730 (e.g., physical, or virtual keyboard), power supply 744 (e.g., battery), speaker 736, microphone 738, and wireless antenna 742. In some aspects, the power supply 744 may directly or indirectly provide the supply voltage for operating some or all of the components of the mobile device 700.

In some aspects, FIG. 7 may include coder/decoder (CODEC) 734 (e.g., an audio and/or voice CODEC) coupled to processor 701; speaker 736 and microphone 738 coupled to CODEC 734; and wireless circuits 740 (which may include a modem, RF circuitry, filters, etc.) coupled to wireless antenna 742 and to processor 701.

In some aspects, one or more of processor 701, display controller 726, memory 732, CODEC 734, and wireless circuits 740 may include one or more ICs including semiconductor structures manufactured according to the examples described in this disclosure.

It should be noted that although FIG. 7 depicts a mobile device 700, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
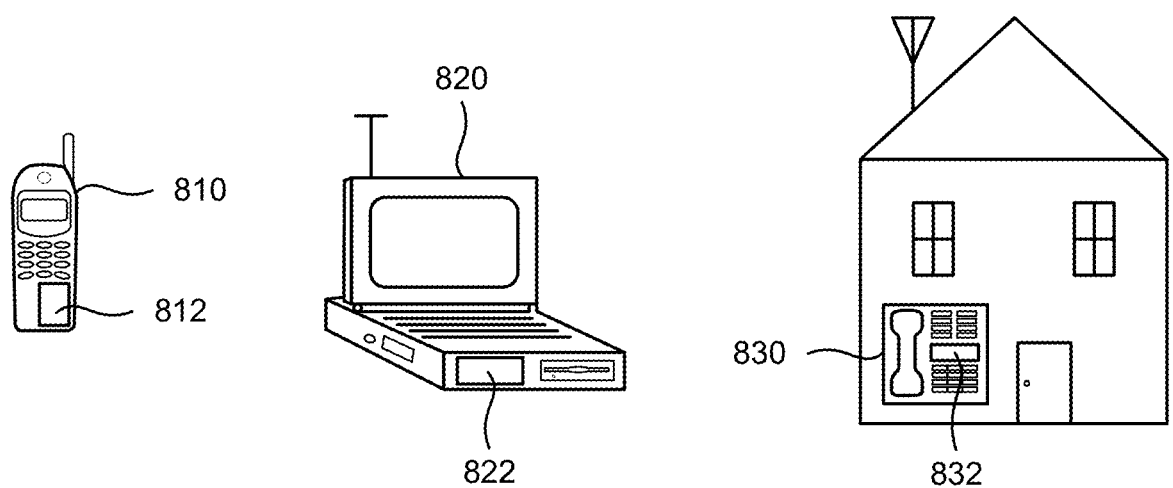
FIG. 8 illustrates various electronic devices that may be integrated with ICs, according to aspects of the disclosure.

FIG. 8 illustrates various electronic devices 810, 820, and 830 that may be integrated with ICs 812, 822, and 832, according to aspects of the disclosure. For example, a mobile phone device 810, a laptop computer device 820, and a fixed location terminal device 830 may each be considered generally user equipment (UE) and may include one or more ICs, such as ICs 812, 822, and 832, and a power supply to provide the supply voltages to power the ICs. The ICs 812, 822, and 832 may be, for example, correspond to an IC including semiconductor structures manufactured based on the examples described above with reference to FIGS. 2A-2C and 5A-5G.

The devices 810, 820, and 830 illustrated in FIG. 8 are merely non-limiting examples. Other electronic devices may also feature the ICs including semiconductor structures as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, a laptop computer, an access point, a base station, or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-8 may be rearranged and/or combined into a single component, process, feature, or function or incorporated in several components, processes, or functions. Additional elements, components, processes, and/or functions may also be added without departing from the disclosure. In some implementations, FIGS. 1-8 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (POP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A semiconductor structure, comprising: a conductive element on an isolation structure; a dielectric film; a first contact structure, wherein at least a portion of the dielectric film is disposed between the conductive element and the first contact structure; and a second contact structure disposed on and electrically coupled with the conductive element, wherein: the dielectric film is configured as a resistive element with the first contact structure and the second contact structure being terminals of the resistive element after a dielectric breakdown has occurred within the portion of the dielectric film, and the dielectric film is configured as an insulator of a capacitive element with the first contact structure and the second contact structure being terminals of the capacitive element in a case that no dielectric breakdown has occurred within the portion of the dielectric film.

Clause 2. The semiconductor structure of clause 1, wherein: the conductive element is over the isolation structure with respect to a vertical direction and extends along a first horizontal direction perpendicular to the vertical direction, and the first contact structure includes one or more first portions extending along the first horizontal direction, one or more first sub-portions of the portion of the dielectric film being respectively disposed between the conductive element and the one or more first portions of the first contact structure.

Clause 3. The semiconductor structure of clause 2, wherein: the first contact structure includes one or more second portions extending along a second horizontal direction perpendicular to the vertical direction, one or more second sub-portions of the portion of the dielectric film being respectively disposed between the conductive element and the one or more second portions of the first contact structure.

Clause 4. The semiconductor structure of any of clauses 1 to 3, wherein: the dielectric film is disposed on sidewalls and an upper surface of the conductive element.

Clause 5. The semiconductor structure of any of clauses 1 to 4, wherein: the dielectric film includes silicon oxide, silicon nitride, hafnium oxide, a low-k dielectric material, or any combination thereof.

Clause 6. The semiconductor structure of any of clauses 1 to 5, wherein the conductive element includes: a polysilicon portion on the isolation structure; and a silicide portion between the polysilicon portion and the second contact structure.

Clause 7. The semiconductor structure of any of clauses 1 to 6, wherein the first contact structure or the second contact structure includes: a conductive filling that includes a refractory material; and an intermediate layer surrounding the conductive filling.

Clause 8. The semiconductor structure of clause 7, wherein: the conductive filling includes tungsten, cobalt, titanium nitride, tantalum nitride, or any combination thereof, and the intermediate layer includes titanium, titanium nitride, or any combination thereof.

Clause 9. The semiconductor structure of any of clauses 1 to 8, wherein: the first contact structure or the second contact structure includes a refractory material.

Clause 10. The semiconductor structure of clause 9, wherein: the refractory material includes tungsten, cobalt, titanium nitride, tantalum nitride, or any combination thereof.

Clause 11. The semiconductor structure of any of clauses 1 to 10, further comprising: a diffusion structure adjacent to the isolation structure; and a silicide structure over the diffusion structure, the first contact structure being disposed on the silicide structure.

Clause 12. A method of manufacturing a semiconductor structure, comprising: forming a conductive element on an isolation structure; forming a dielectric film adjacent to the conductive element; forming an interlayer dielectric layer over the conductive element and the dielectric film; forming a first opening through the interlayer dielectric layer based on a self-aligned contact etch process, the first opening at least partially exposing the dielectric film; forming a second opening through the interlayer dielectric layer and the dielectric film, and the second opening at least partially exposing an upper surface of the conductive element; forming a first contact structure in the first opening, at least a portion of the dielectric film being disposed between the conductive element and the first contact structure; and forming a second contact structure in the second opening, the second contact structure being above and electrically coupled with the conductive element.

Clause 13. The method of clause 12, wherein: the conductive element is over the isolation structure with respect to a vertical direction and extends along a first horizontal direction perpendicular to the vertical direction, and the first contact structure includes one or more first portions extending along the first horizontal direction, one or more first sub-portions of the portion of the dielectric film being respectively disposed between the conductive element and the one or more first portions of the first contact structure.

Clause 14. The method of clause 13, wherein: the first contact structure includes one or more second portions extending along a second horizontal direction perpendicular to the vertical direction, one or more second sub-portions of the portion of the dielectric film being respectively disposed between the conductive element and the one or more second portions of the first contact structure.

Clause 15. The method of any of clauses 12 to 14, wherein the forming the dielectric film comprises: forming the dielectric film on sidewalls and the upper surface of the conductive element.

Clause 16. The method of any of clauses 12 to 15, wherein: the forming the dielectric film is performed based on a chemical vapor deposition (CVD) process.

Clause 17. The method of any of clauses 12 to 16, wherein: the dielectric film includes silicon oxide, silicon nitride, hafnium oxide, a low-k dielectric material, or any combination thereof.

Clause 18. The method of any of clauses 12 to 17, wherein forming the conductive element comprises: forming a polysilicon structure on the isolation structure; and after the second opening is formed, converting an upper portion of the polysilicon structure into a silicide portion of the conductive element and leaving a lower portion of the polysilicon structure as a polysilicon portion of the conductive element.

Clause 19. The method of any of clauses 12 to 18, wherein the forming the first contact structure or the forming the second contact structure includes: forming an intermediate layer in the first opening or the second opening; and filing the first opening or the second opening with a conductive filling that includes a refractory material, such that the intermediate layer surrounding the conductive filling in the first opening or the second opening.

Clause 20. The method of clause 19, wherein: the conductive filling includes tungsten, cobalt, titanium nitride, tantalum nitride, or any combination thereof, and the intermediate layer includes titanium, titanium nitride, or any combination thereof.

Clause 21. The method of any of clauses 12 to 20, wherein the forming the first contact structure or the forming the second contact structure includes: filing the first opening or the second opening with a refractory material.

Clause 22. The method of any of clauses 12 to 21, further comprising: forming a diffusion region adjacent to the isolation structure, after the first opening is formed, converting an upper portion of the diffusion region into a silicide structure, and leaving a lower portion of the diffusion region as a diffusion structure.

Clause 23. A one-time programmable (OTP) memory array, comprising: a plurality of bit lines; a plurality of word lines; and a plurality of memory cells, each memory cell being configured to be electrically coupled to one of the plurality of bit lines based on a selection of the corresponding memory cell by one of the plurality of word lines, wherein each memory cell of the plurality of memory cells comprises: a conductive element on an isolation structure; a dielectric film; a first contact structure, wherein at least a portion of the dielectric film is disposed between the conductive element and the first contact structure; and a second contact structure disposed on and electrically coupled with the conductive element, wherein: the dielectric film is configured as a resistive element with the first contact structure and the second contact structure being terminals of the resistive element after a dielectric breakdown has occurred within the portion of the dielectric film, and the dielectric film is configured as an insulator of a capacitive element with the first contact structure and the second contact structure being terminals of the capacitive element in a case that no dielectric breakdown has occurred within the portion of the dielectric film.

Clause 24. The OTP memory array of clause 23, wherein, for each memory cell: the conductive element is over the isolation structure with respect to a vertical direction and extends along a first horizontal direction perpendicular to the vertical direction, and the first contact structure includes one or more first portions extending along the first horizontal direction, one or more first sub-portions of the portion of the dielectric film being respectively disposed between the conductive element and the one or more first portions of the first contact structure.

Clause 25. The OTP memory array of clause 24, wherein, for each memory cell: the first contact structure includes one or more second portions extending along a second horizontal direction perpendicular to the vertical direction, one or more second sub-portions of the portion of the dielectric film being respectively disposed between the conductive element and the one or more second portions of the first contact structure.

Clause 26. The OTP memory array of any of clauses 23 to 25, wherein, for each memory cell: the dielectric film is disposed on sidewalls and an upper surface of the conductive element.

Clause 27. The OTP memory array of any of clauses 23 to 26, wherein: the dielectric film includes silicon oxide, silicon nitride, hafnium oxide, a low-k dielectric material, or any combination thereof.

Clause 28. The OTP memory array of any of clauses 23 to 27, wherein, for each memory cell, the conductive element includes: a polysilicon portion on the isolation structure; and a silicide portion between the polysilicon portion and the second contact structure.

Clause 29. The OTP memory array of any of clauses 23 to 28, wherein, for each memory cell, the first contact structure or the second contact structure includes: a conductive filling that includes a refractory material; and an intermediate layer surrounding the conductive filling.

Clause 30. The OTP memory array of clause 29, wherein, for each memory cell: the conductive filling includes tungsten, cobalt, titanium nitride, tantalum nitride, or any combination thereof, and the intermediate layer includes titanium, titanium nitride, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A semiconductor structure, comprising:
   a conductive element on an isolation structure;
   a dielectric film;
   a first contact structure including a conductive filling and an intermediate layer surrounding the conductive filling, wherein at least a portion of the dielectric film is disposed between the conductive element and the first contact structure and is in direct contact with the intermediate layer; and
   a second contact structure disposed on and electrically coupled with the conductive element,
   wherein:
   the dielectric film is configured as a resistive element with the first contact structure and the second contact structure being terminals of the resistive element after a dielectric breakdown has occurred within the portion of the dielectric film, and
   the dielectric film is configured as an insulator of a capacitive element with the first contact structure and the second contact structure being terminals of the capacitive element in a case that no dielectric breakdown has occurred within the portion of the dielectric film.

2. The semiconductor structure of claim 1, wherein:
   the conductive element is over the isolation structure with respect to a vertical direction and extends along a first horizontal direction perpendicular to the vertical direction, and
   the first contact structure includes one or more first portions extending along the first horizontal direction, one or more first sub-portions of the portion of the dielectric film being respectively disposed between the conductive element and the one or more first portions of the first contact structure.

3. The semiconductor structure of claim 2, wherein:
   the first contact structure includes one or more second portions extending along a second horizontal direction perpendicular to the vertical direction, one or more second sub-portions of the portion of the dielectric film being respectively disposed between the conductive element and the one or more second portions of the first contact structure.

4. The semiconductor structure of claim 1, wherein:
   the dielectric film is disposed on sidewalls and an upper surface of the conductive element.

5. The semiconductor structure of claim 1, wherein:
   the dielectric film includes silicon oxide, silicon nitride, hafnium oxide, a low-k dielectric material, or any combination thereof.

6. The semiconductor structure of claim 1, wherein the conductive element includes:
   a polysilicon portion on the isolation structure; and
   a silicide portion between the polysilicon portion and the second contact structure.

7. The semiconductor structure of claim 1, wherein the first contact structure or the second contact structure includes:
   a conductive filling that includes a refractory material; and
   an intermediate layer surrounding the conductive filling.

8. The semiconductor structure of claim 7, wherein:
   the conductive filling includes tungsten, cobalt, titanium nitride, tantalum nitride, or any combination thereof, and
   the intermediate layer includes titanium, titanium nitride, or any combination thereof.

9. The semiconductor structure of claim 1, wherein:
   the first contact structure or the second contact structure includes a refractory material.

10. The semiconductor structure of claim 9, wherein:
    the refractory material includes tungsten, cobalt, titanium nitride, tantalum nitride, or any combination thereof.

11. The semiconductor structure of claim 1, further comprising:
    a diffusion structure adjacent to the isolation structure; and
    a silicide structure over the diffusion structure, the first contact structure being disposed on the silicide structure.

12. A method of manufacturing a semiconductor structure, comprising:
    forming a conductive element on an isolation structure;
    forming a dielectric film adjacent to the conductive element;

forming an interlayer dielectric layer over the conductive element and the dielectric film;
forming a first opening through the interlayer dielectric layer based on a self-aligned contact etch process, the first opening at least partially exposing the dielectric film;
forming a second opening through the interlayer dielectric layer and the dielectric film, and the second opening at least partially exposing an upper surface of the conductive element;
forming a first contact structure in the first opening structure, wherein the first contact structure includes a conductive filling and an intermediate layer surrounding the conductive filling, and wherein at least a portion of the dielectric film is disposed between the conductive element and the first contact structure and is in direct contact with the intermediate layer; and
forming a second contact structure in the second opening, the second contact structure being above and electrically coupled with the conductive element.

13. The method of claim 12, wherein:
the conductive element is over the isolation structure with respect to a vertical direction and extends along a first horizontal direction perpendicular to the vertical direction, and
the first contact structure includes one or more first portions extending along the first horizontal direction, one or more first sub-portions of the portion of the dielectric film being respectively disposed between the conductive element and the one or more first portions of the first contact structure.

14. The method of claim 13, wherein:
the first contact structure includes one or more second portions extending along a second horizontal direction perpendicular to the vertical direction, one or more second sub-portions of the portion of the dielectric film being respectively disposed between the conductive element and the one or more second portions of the first contact structure.

15. The method of claim 12, wherein the forming the dielectric film comprises:
forming the dielectric film on sidewalls and the upper surface of the conductive element.

16. The method of claim 12, wherein:
the forming the dielectric film is performed based on a chemical vapor deposition (CVD) process.

17. The method of claim 12, wherein:
the dielectric film includes silicon oxide, silicon nitride, hafnium oxide, a low-k dielectric material, or any combination thereof.

18. The method of claim 12, wherein forming the conductive element comprises:
forming a polysilicon structure on the isolation structure; and
after the second opening is formed, converting an upper portion of the polysilicon structure into a silicide portion of the conductive element and leaving a lower portion of the polysilicon structure as a polysilicon portion of the conductive element.

19. The method of claim 12, wherein the forming the first contact structure or the forming the second contact structure includes:
forming an intermediate layer in the first opening or the second opening; and
filling the first opening or the second opening with a conductive filling that includes a refractory material, such that the intermediate layer surrounding the conductive filling in the first opening or the second opening.

20. The method of claim 19, wherein:
the conductive filling includes tungsten, cobalt, titanium nitride, tantalum nitride, or any combination thereof, and
the intermediate layer includes titanium, titanium nitride, or any combination thereof.

21. The method of claim 12, wherein the forming the first contact structure or the forming the second contact structure includes:
filling the first opening or the second opening with a refractory material.

22. The method of claim 12, further comprising:
forming a diffusion region adjacent to the isolation structure,
after the first opening is formed, converting an upper portion of the diffusion region into a silicide structure, and leaving a lower portion of the diffusion region as a diffusion structure.

23. A one-time programmable (OTP) memory array, comprising:
a plurality of bit lines;
a plurality of word lines; and
a plurality of memory cells, each memory cell being configured to be electrically coupled to one of the plurality of bit lines based on a selection of the corresponding memory cell by one of the plurality of word lines,
wherein each memory cell of the plurality of memory cells comprises:
a conductive element on an isolation structure;
a dielectric film;
a first contact structure including a conductive filling and an intermediate layer surrounding the conductive filling, wherein at least a portion of the dielectric film is disposed between the conductive element and the first contact structure and is in direct contact with the intermediate layer; and
a second contact structure disposed on and electrically coupled with the conductive element,
wherein:
the dielectric film is configured as a resistive element with the first contact structure and the second contact structure being terminals of the resistive element after a dielectric breakdown has occurred within the portion of the dielectric film, and
the dielectric film is configured as an insulator of a capacitive element with the first contact structure and the second contact structure being terminals of the capacitive element in a case that no dielectric breakdown has occurred within the portion of the dielectric film.

24. The OTP memory array of claim 23, wherein, for each memory cell:
the conductive element is over the isolation structure with respect to a vertical direction and extends along a first horizontal direction perpendicular to the vertical direction, and
the first contact structure includes one or more first portions extending along the first horizontal direction, one or more first sub-portions of the portion of the dielectric film being respectively disposed between the conductive element and the one or more first portions of the first contact structure.

25. The OTP memory array of claim 24, wherein, for each memory cell:
the first contact structure includes one or more second portions extending along a second horizontal direction perpendicular to the vertical direction, one or more second sub-portions of the portion of the dielectric film being respectively disposed between the conductive element and the one or more second portions of the first contact structure.

26. The OTP memory array of claim 23, wherein, for each memory cell:
the dielectric film is disposed on sidewalls and an upper surface of the conductive element.

27. The OTP memory array of claim 23, wherein:
the dielectric film includes silicon oxide, silicon nitride, hafnium oxide, a low-k dielectric material, or any combination thereof.

28. The OTP memory array of claim 23, wherein, for each memory cell, the conductive element includes:
a polysilicon portion on the isolation structure; and
a silicide portion between the polysilicon portion and the second contact structure.

29. The OTP memory array of claim 23, wherein, for each memory cell, the first contact structure or the second contact structure includes:
a conductive filling that includes a refractory material; and
an intermediate layer surrounding the conductive filling.

30. The OTP memory array of claim 29, wherein, for each memory cell:
the conductive filling includes tungsten, cobalt, titanium nitride, tantalum nitride, or any combination thereof, and
the intermediate layer includes titanium, titanium nitride, or any combination thereof.

* * * * *